United States Patent [19]

Wong et al.

[11] Patent Number: 5,784,019
[45] Date of Patent: Jul. 21, 1998

[54] DIGITAL TO ANALOG CONVERTER FOR GENERATING DISTRIBUTIVE ANALOG CONTROL SIGNALS UTILIZING DIGITAL SIGNAL GENERATOR AND CONTROL SIGNAL GENERATOR

[75] Inventors: Hee Wong, San Jose; Abhijit Phanse, Santa Clara, both of Calif.

[73] Assignee: National Semiconductor Corporation, Santa Clara, Calif.

[21] Appl. No.: 791,367

[22] Filed: Jan. 30, 1997

[51] Int. Cl.$^6$ .................................................. H03M 1/00
[52] U.S. Cl. ........................ 341/141; 341/144; 341/145; 341/152
[58] Field of Search ........................ 341/144, 145, 341/146, 147, 148, 63, 64, 74, 141, 152

[56] References Cited

U.S. PATENT DOCUMENTS

| | | | |
|---|---|---|---|
| 4,400,692 | 8/1983 | Klein | 341/152 |
| 4,484,178 | 11/1984 | Lovgren et al. | 341/152 |
| 4,583,077 | 4/1986 | Yasuda et al. | 341/145 |
| 4,636,773 | 1/1987 | Lewis et al. | 341/152 |
| 5,337,338 | 8/1994 | Sutton et al. | 341/53 |
| 5,574,455 | 11/1996 | Hori et al. | 341/143 |

Primary Examiner—Jeffrey A. Gaffin
Assistant Examiner—Kim N. Huynh
Attorney, Agent, or Firm—Limbach & Limbach L.L.P.

[57] ABSTRACT

A digital-to-analog converter for converting a multiple bit digital input signal into multiple representative analog output signals includes a pulse density modulator, a logic controller, signal selection logic circuits and resistive-capacitive lowpass output filters. The pulse density modulator receives the N-M least significant bits of an N-bit digital input signal and in accordance therewith generates a pulse density modulated digital signal with a pulse density corresponding to a digital count of such N-M least significant bits. The logic controller receives the M most significant bits of the N-bit digital input signal and in accordance therewith generates multiple pairs of digital control signals. Each of the signal selection logic circuits receives the pulse density modulated digital signal and a respective pair of the digital control signals and in accordance therewith provides a respective one of a number of digital output signals. Together, each pair of digital control signals determines whether one of them or the pulse density modulated digital signal is provided as the respective digital output signal. The output filters lowpass filter the digital output signals to convert them to analog signals. The resulting analog signals represent a digital count of the original digital signal bits.

23 Claims, 4 Drawing Sheets

DIGITAL TO ANALOG CONVERTER FOR GENERATING DISTRIBUTIVE ANALOG CONTROL SIGNALS UTILIZING DIGITAL SIGNAL GENERATOR AND CONTROL SIGNAL GENERATOR

BACKGROUND OF THE INVENTION

1. Field of the Invention

The present invention relates to distributed control signal generators for producing multiple related control signals, and in particular, to such control signal generators using digital-to-analog conversion.

2. Description of the Related Art

In many combination digital and analog systems, there is often a need for generating multiple analog control signals based upon a single master digital control signal. For example, the master digital control signal may consist of N bits from which it is necessary to generate many distributed analog control signals based upon such N-bit digital signal. While perhaps simple in concept, such distributed analog control signal generators tends to be rather complex and often produce analog output signals having undesirable transient signal components, or "glitches."

SUMMARY OF THE INVENTION

A distributive digital-to-analog converter in accordance with the present invention converts an N-bit digital signal into $2^M$ distributed analog signals (where M<N), where each analog output signal corresponds to a digital count of $2^{N-M}-1$. A single digital signal generator is used for generating all of the analog output signals, with precision switching between minimum and maximum analog signal levels and significantly reduced transient signal components.

In accordance with one embodiment of the present invention, a digital-to-digital converter for converting input digital signal bits into representative digital output signals includes a digital signal generator, a control signal generator and a plurality of signal selectors. The digital signal generator is configured to receive a first portion of a plurality of input digital signal bits and in accordance therewith provide one or more intermediate digital signals with one or more corresponding digital pulse densities which correspond to a digital count of such first portion of the plurality of input digital signal bits. The control signal generator is configured to receive a second portion of the plurality of input digital signal bits and in accordance therewith provide a plurality of digital control signal sets. The signal selectors are coupled to the digital signal generator and the control signal generator. Each one of the signal selectors is configured to receive the one or more intermediate digital signals and a corresponding one of the digital control signal sets and in accordance therewith provide a corresponding one of a plurality of digital output signals. Each one of the digital control signal sets determines whether the one or more intermediate digital signals or an individual signal of such digital control signal set is provided as the corresponding one of the digital output signals.

These and other features and advantages of the present invention will be understood upon consideration of the following detailed description of the invention and the accompanying drawings.

DETAILED DESCRIPTION OF THE INVENTION

Figure 1:
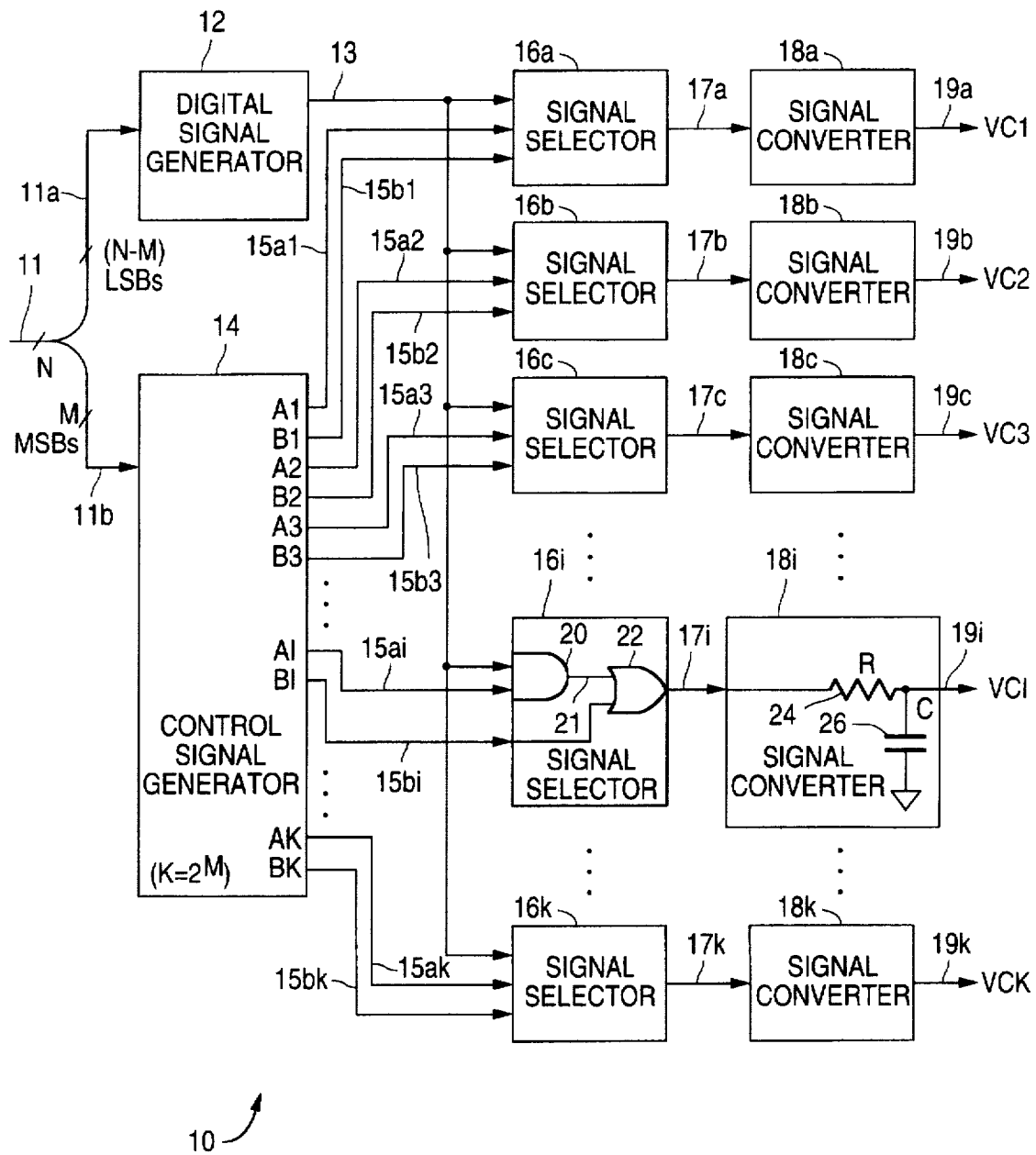
FIG. 1 is a functional block diagram of a distributive digital-to-analog converter in accordance with one embodiment of the present invention.

Referring to FIG. 1, a distributive digital-to-analog converter 10 in accordance with one embodiment of the present invention includes a digital signal generator 12, control signal generator 14, multiple signal selectors 16 and multiple signal converters 18, all interconnected substantially as shown. An N-bit digital signal 11 is received with its N-M least significant bits 11a being distributed to the digital signal generator 12 and its M most significant bits 11b being distributed to the control signal generator 14. The digital signal generator 12 (e.g., a pulse density modulator) generates a pulsed digital signal 13 with a pulse density which is proportional to the digital count of the N-M least significant bits 11a of the digital input signal 11. This pulsed digital signal 13 is distributed to each of the signal selectors 16. (In this embodiment, the pulsed digital signal 13 is 1-bit wide, but, as discussed in more detail below, it can also be P-bits wide with each of the P individual signals having its own respective pulse density which is proportional to the digital count of the N-M least significant bits 11a of the digital input signal 11.)

The control signal generator 14 generates K pairs of digital control signals 15a, 15b, where $K=2^M$. Each pair of control signals 15a, 15b is distributed to a respective one of the signal selectors 16 for determining whether the output of such signal selector 16 is a logic 0, a logic 1 or the pulsed digital signal 13 (discussed in more detail below). In accordance with one embodiment of the present invention, each signal selector 16 consists of a logic AND gate 20 for logically ANDing the pulsed digital signal 13 and first digital control signal 15a, and a logic OR gate 22 for logically ORing the result of such ANDing operation and the second digital control signal 15b.

For an M-bit input signal 11b and an index I, the logic states of the individual control signals 15a, 15b can be described by (and the appropriate Boolean logic for implementing the control signal generator 14 can be designed from) the following expressions:

I=(integer digital count of M -bit input 11b)+1; therefore $1 \leq I \leq 2^M$

AI=1 (logic 1)

AJ=0 (logic 0) for J>I

AJ=X ("don't care") for J<I

BJ=1 (logic 1) for J<I

BJ=0 (logic 0) for J≥I

I≠J (I and J are unequal positive integers).

The resulting digital output signals 17 from the individual signal selectors 16 are converted by their respective signal converters 18 to individual analog output signals 19. According to one embodiment of the present invention, each signal converter 18 is a lowpass filter consisting of a series resistor 24 and shunt capacitor 26 (often referred to as an "anti-alias" filter).

Figure 2:
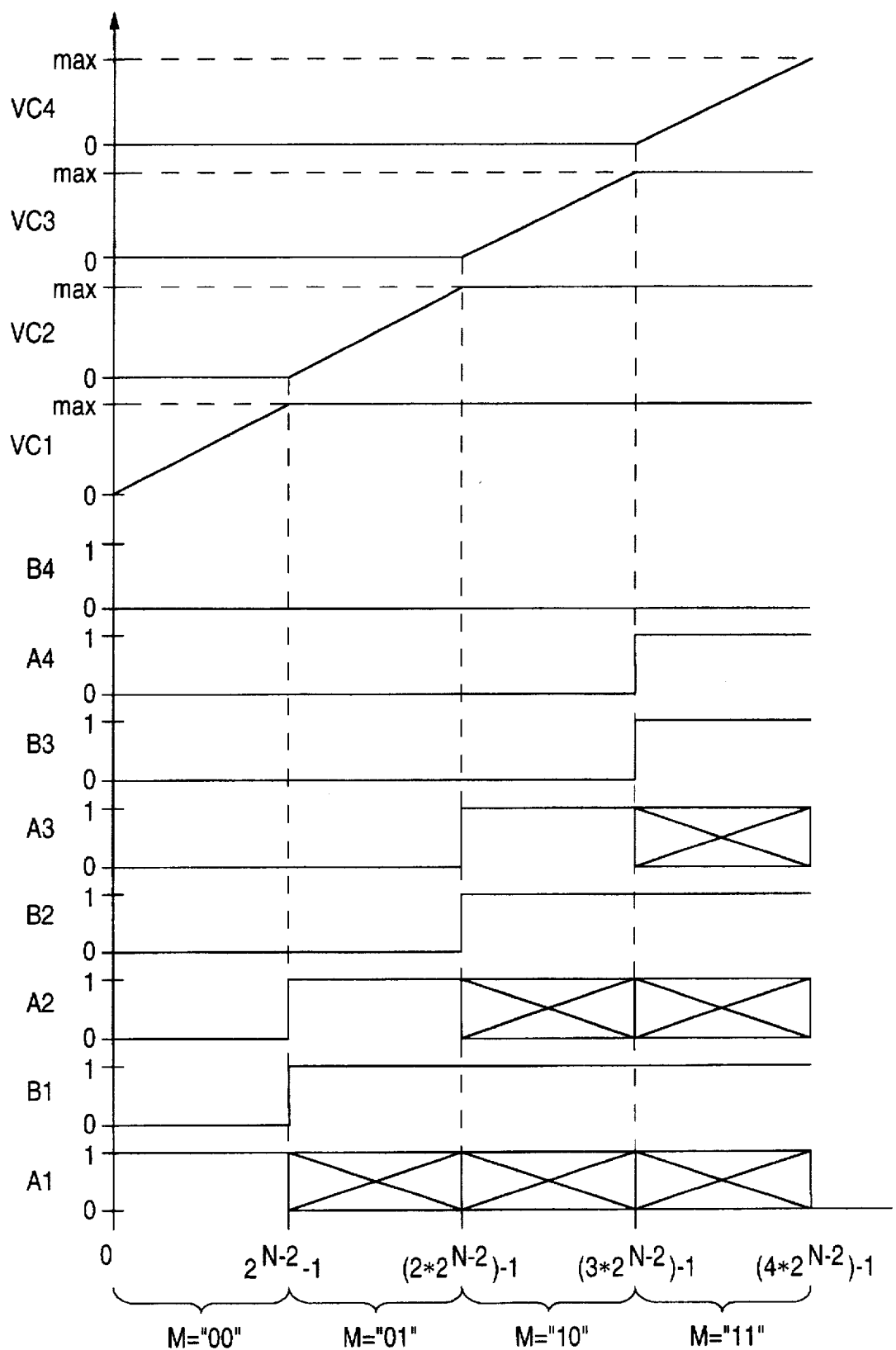
FIG. 2 illustrates the timing relationships among the digital control signals and analog output signals for the distributive digital-to-analog converter of FIG. 1 where M=2.

Referring to FIG. 2, the above-discussed digital-to-analog conversion in accordance with the present invention is illustrated for converting the N-bit input signal 11 into four (i.e., M=2) distributed analog signals 19a, 19b, 19c, 19d. When the digital count of the N-bit input 11 is between 0 and $2^{N-2}-1$, i.e., when the M-bit input 11b to the control signal generator 14 (FIG. 1) is "00", A1=1 and A2=A3=A4=B1=B2=B3=B4=0, and the output voltage VC1 ramps up from zero volts to its maximum value which is an analog voltage corresponding to the digital count $2^{N-2}-1$. When the digital count of the N-bit input 11 is between $2^{N-2}-1$ and $2*2^{N-2}-1$, i.e., when the M-bit input 11b is "01", A1=X, B1=A2=1, A3=A4=B2=B3=B4=0 and the output voltage VC2 ramps up from zero volts to its maximum which corresponds to the digital count of $2^{N-2}-1$. Output voltages VC3 and VC4 are controlled and generated in a similar manner.

Figure 3:
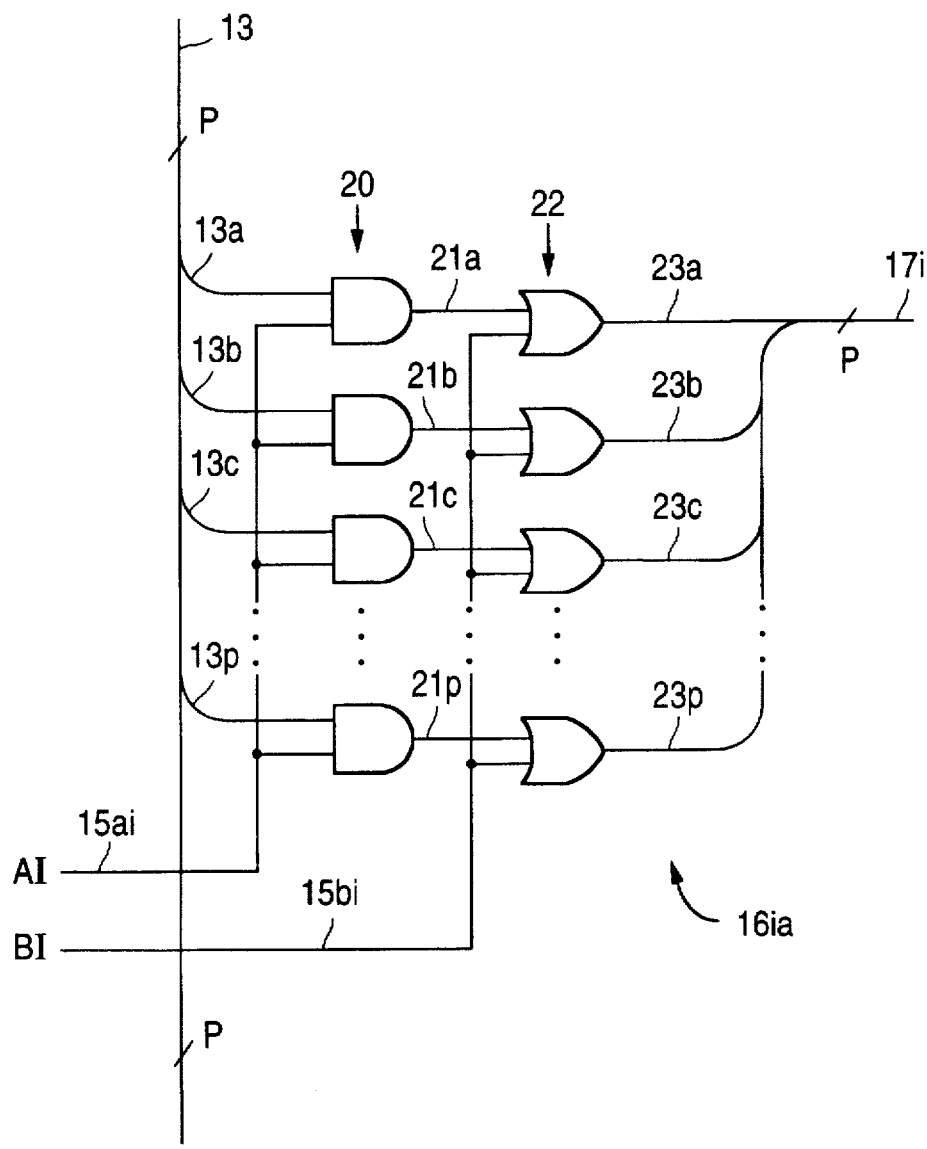
FIG. 3 is a logic diagram of an alternative embodiment of the signal selectors of FIG. 1.

Referring to FIG. 3, in accordance with another embodiment of the present invention, as noted above, the pulsed digital signal 13 from the digital signal generator 12 (FIG. 1) can be P-bits wide. Accordingly, each signal selector 16ia will have multiple AND gates 20 on the input side and multiple OR gates 22 on the output side. Each of the P individual bits 13a, 13b, 13c, . . . , 13p of the pulsed digital signal 13 is gated by the AI control signal 15ai. The resulting gated signals 21a, 21b, 21c, . . . , 21p are logically ORed with the BI control signal 15bi. The resulting output signals 23a, 23b, 23c, . . . , 23p form the individual bits of a P-bit wide digital output signal 17i for conversion to an analog signal 19i with the signal converter 18i.

Figure 4A:
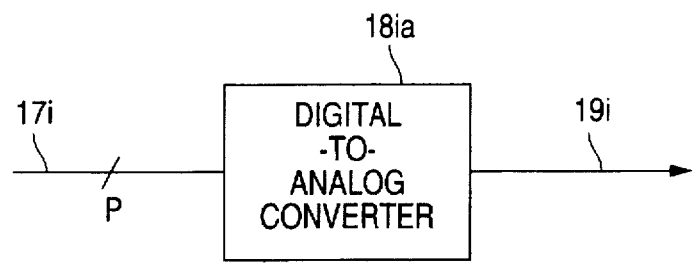
FIGS. 4A, 4B and 4C are functional block diagrams of alternative embodiments of the signal converters of FIG. 1.
Figure 4B:
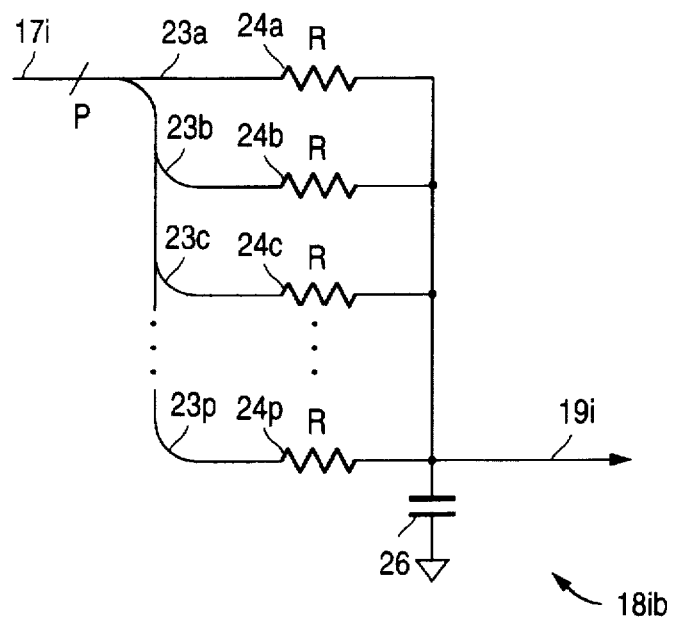
Figure 4C:
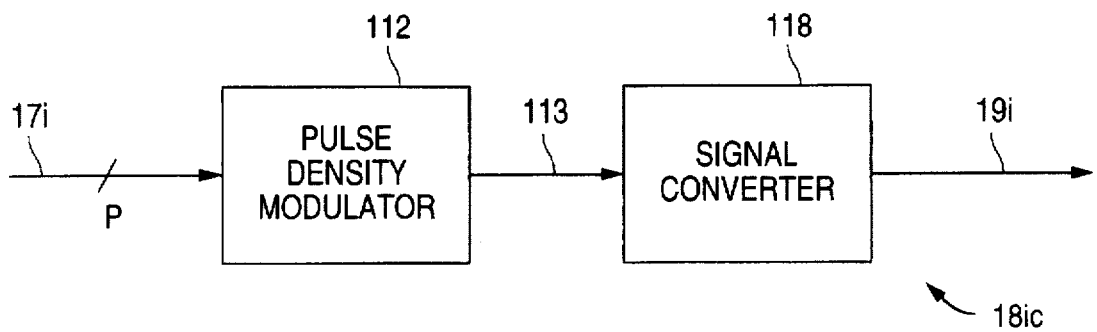

Referring to FIGS. 4A, 4B and 4C, in accordance with further embodiments of the present invention, when the digital output signals 17 from the signal selectors 16 are P-bits wide, the signal converters 18 can be implemented in a number of ways. For example, each signal converter 18 can be a digital-to-analog converter 18ia (FIG. 4A), many types of which are well-known in the art. Alternatively, each signal converter 18 can be implemented as a lowpass filter 18ib (FIG. 4B), as discussed above, with multiple resistors 24 for combining the individual input signals 23. Further alternatively, the input stage to the signal converter 18ic (FIG. 4C) can be a pulse density modulator 112 which converts the P-bit wide input signal 17i to a pulse density modulated signal 113 which is then converted by a signal converter 118 to produce the analog output signal 19i. Such signal converter 118 can be a digital-to-analog converter or lowpass filter, as discussed above. Further, the pulse density modulated signal 113 can be one or more bits wide, as desired.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a digital-to-digital converter for converting a plurality of input digital signal bits into a plurality of representative digital output signals, comprising:

a digital signal generator configured to receive a first portion of a plurality of input digital signal bits and in accordance therewith provide one or more intermediate digital signals with one or more corresponding digital pulse densities which vary in relation to and correspond to a digital count of said first portion of said plurality of input digital signal bits;

a control signal generator configured to receive a second portion of said plurality of input digital signal bits and in accordance therewith provide a plurality of digital control signal sets; and a plurality of signal selectors, coupled to said digital signal generator and said control signal generator, wherein each one of said plurality of signal selectors is configured to receive said one or more intermediate digital signals and a corresponding one of said plurality of digital control signal sets and in accordance therewith provide a corresponding one of a plurality of digital output signals, and wherein each one of said plurality of digital control signal sets determines whether said one or more intermediate digital signals or an individual signal of said each one of said plurality of digital control signal sets is provided as said corresponding one of said plurality of digital output signals.

2. The apparatus of claim 1, wherein, in accordance with said second portion of said plurality of digital signal bits:

one of said plurality of digital output signals comprises said one or more intermediate digital signals;

each one of all others of said plurality of digital output signals comprises said individual signal of a corresponding one of said plurality of digital control signal sets; and said plurality of digital output signals represents a digital count of said plurality of input digital signal bits.

3. The apparatus of claim 1, wherein said digital signal generator comprises a pulse density modulator.

4. The apparatus of claim 1, wherein said plurality of signal selectors comprises a plurality of logic circuits configured to logically combine said one or more intermediate digital signals and said corresponding one of said plurality of digital control signal sets.

5. The apparatus of claim 1, further comprising a plurality of signal converters, coupled to said plurality of signal selectors, configured to receive and convert said plurality of digital output signals to a plurality of analog output signals, wherein said plurality of analog output signals represents a digital count of said plurality of input digital signal bits.

6. The apparatus of claim 5, wherein each one of said plurality of signal converters comprises a digital-to-analog converter.

7. The apparatus of claim 6, wherein each one of said plurality of signal converters comprises a resistive and capacitive filter.

8. The apparatus of claim 5, wherein each one of said plurality of signal converters comprises:

a pulse generation circuit configured to receive and convert a portion of said plurality of digital output signals to one or more digital pulse signals with one or more digital pulse densities which correspond to a digital count of said portion of said plurality of digital output signals; and a pulse conversion circuit, coupled to said pulse generation circuit, configured to receive and convert said one or more digital pulse signals to one of said plurality of analog output signals.

9. The apparatus of claim 8, wherein:

said pulse generation circuit comprises a pulse density modulator; and said pulse conversion circuit comprises a digital-to-analog converter.

10. A method of converting a plurality of input digital signal bits into a plurality of representative digital output signals, comprising the steps of:

receiving a first portion of a plurality of input digital signal bits and in accordance therewith generating one or more intermediate digital signals with one or more corresponding digital pulse densities which vary in relation to and correspond to a digital count of said first portion of said plurality of input digital signal bits;

receiving a second portion of said plurality of input digital signal bits and in accordance therewith generating a plurality of digital control signal sets; and receiving said one or more intermediate digital signals and a corresponding one of said plurality of digital control signal sets and in accordance therewith generating a corresponding one of a plurality of digital output signals, wherein each one of said plurality of digital control signal sets determines whether said one or more intermediate digital signals or an individual signal of said each one of said plurality of digital control signal sets is provided as said corresponding one of said plurality of digital output signals.

11. The method of claim 10, wherein, in accordance with said second portion of said plurality of digital signal bits, said step of receiving said one or more intermediate digital signals and a corresponding one of said plurality of digital control signal sets and in accordance therewith generating a corresponding one of a plurality of digital output signals comprises:

outputting said one or more intermediate digital signals as one of said plurality of digital output signals; and outputting said individual signal of a corresponding one of said plurality of digital control signal sets as each one of all others of said plurality of digital output signals;

wherein said plurality of digital output signals represents a digital count of said plurality of input digital signal bits.

12. The method of claim 10, wherein said step of receiving a first portion of a plurality of input digital signal bits and in accordance therewith generating one or more intermediate digital signals with one or more corresponding digital pulse densities which vary in relation to and correspond to a digital count of said first portion of said plurality of input digital signal bits comprises generating one or more pulse density modulated signals as said one or more intermediate digital signals.

13. The method of claim 10, said step of receiving said one or more intermediate digital signals and a corresponding one of said plurality of digital control signal sets and in accordance therewith generating a corresponding one of a plurality of digital output signals comprises logically combining said one or more intermediate digital signals and said corresponding one of said plurality of digital control signal sets.

14. The method of claim 10, further comprising the step of converting said plurality of digital output signals to a plurality of analog output signals, wherein said plurality of analog output signals represents a digital count of said plurality of input digital signal bits.

15. The method of claim 14, wherein said step of converting said plurality of digital output signals to a plurality of analog output signals comprises resistively and capacitively filtering said plurality of digital output signals.

16. The method of claim 14, wherein said step of converting said plurality of digital output signals to a plurality of analog output signals comprises:

converting said plurality of digital output signals to a plurality of digital pulse signals with a corresponding plurality of digital pulse densities which correspond to a digital count of said plurality of digital output signals; and converting said plurality of digital pulse signals to said plurality of analog output signals.

17. The method of claim 16, wherein said step of converting said plurality of digital output signals to a plurality of digital pulse signals with a corresponding plurality of digital pulse densities which correspond to a digital count of said plurality of digital output signals comprises generating a plurality of pulse density modulated signals as said plurality of digital pulse signals.

18. An apparatus including a digital-to-digital converter for converting a plurality of input digital signal bits into a plurality of representative digital output signals, comprising:

a digital signal generator configured to receive a first portion of a plurality of input digital signal bits and in accordance therewith provide one or more intermediate digital signals with one or more corresponding digital pulse densities which correspond to a digital count of said first portion of said plurality of input digital signal bits;

a control signal generator configured to receive a second portion of said plurality of input digital signal bits and in accordance therewith provide a plurality of digital control signal sets; and a plurality of signal selectors, coupled to said digital signal generator and said control signal generator, wherein each one of said plurality of signal selectors is configured to receive said one or more intermediate digital signals and a corresponding one of said plurality of digital control signal sets and in accordance therewith provide a corresponding one of a plurality of digital output signals, and wherein each one of said plurality of digital control signal sets determines whether said one or more intermediate digital signals or an individual signal of said each one of said plurality of digital control signal sets is provided as said corresponding one of said plurality of digital output signals;

wherein said plurality of input digital signal bits comprises N bits including N-M less significant bits as said first portion thereof and M more significant bits as said second portion thereof, and wherein each one of said one or more corresponding digital pulse densities corresponds to an integer count R where $0 \leq R \leq 2^{(N-M)}-1$.

19. An apparatus including a digital-to-digital converter for converting a plurality of input digital signal bits into a plurality of representative digital output signals, comprising:

a digital signal generator configured to receive a first portion of a plurality of input digital signal bits and in accordance therewith provide one or more intermediate digital signals with one or more corresponding digital pulse densities which correspond to a digital count of said first portion of said plurality of input digital signal bits;

a control signal generator configured to receive a second portion of said plurality of input digital signal bits and in accordance therewith provide a plurality of digital control signal sets; and a plurality of signal selectors, coupled to said digital signal generator and said control signal generator, wherein each one of said plurality of signal selectors is configured to receive said one or more intermediate digital signals and a corresponding one of said plurality of digital control signal sets and in accordance therewith provide a corresponding one of a plurality of digital output signals, and wherein each one of said plurality of digital control signal sets determines whether said one or more intermediate digital signals or an individual signal of said each one of said plurality of digital control signal sets is provided as said corresponding one of said plurality of digital output signals;

wherein said second portion of said plurality of input digital signal bits comprises an M-bit signal, said plurality of digital control signal sets comprises I digital control signal sets, I and J are unequal positive integers, I=integer digital count of said M-bit signal+1, and $1 \leq I \leq 2^M$, each one of said plurality of digital control signal sets includes a first digital control signal $A_J$, and a second digital control signal $B_J$, and said control signal generator is configured to generate said plurality of digital control signal sets in accordance with said second portion of said plurality of input digital signal bits such that $A_J=1$ (logic 1), $A_J=0$ (logic 0) for J>I, $A_J=X$ ("don't care") for J<I, $B_J=1$ (logic 1) for J<I, and $B_J=0$ (logic 0) for J≥I.

20. An apparatus including a digital-to-digital converter for converting a plurality of input digital signal bits into a plurality of representative digital output signals, comprising:

a digital signal generator configured to receive a first portion of a plurality of input digital signal bits and in accordance therewith provide one or more intermediate digital signals with one or more corresponding digital pulse densities which correspond to a digital count of said first portion of said plurality of input digital signal bits;

a control signal generator configured to receive a second portion of said plurality of input digital signal bits and in accordance therewith provide a plurality of digital control signal sets;

a plurality of signal selectors, coupled to said digital signal generator and said control signal generator, wherein each one of said plurality of signal selectors is configured to receive said one or more intermediate digital signals and a corresponding one of said plurality of digital control signal sets and in accordance therewith provide a corresponding one of a plurality of digital output signals, and wherein each one of said plurality of digital control signal sets determines whether said one or more intermediate digital signals or an individual signal of said each one of said plurality of digital control signal sets is provided as said corresponding one of said plurality of digital output signals; and a plurality of signal converters, coupled to said plurality of signal selectors, configured to receive and convert said plurality of digital output signals to a plurality of analog output signals, wherein said plurality of analog output signals represents a digital count of said plurality of input digital signal bits;

wherein said plurality of input digital signal bits comprises N bits including N-M less significant bits as said first portion thereof and M more significant bits as said second portion thereof, and wherein each one of said plurality of analog output signals has a value which corresponds to an integer count R where $0 \leq R \leq 2^{(N-M)}-1$.

21. A method of converting a plurality of input digital signal bits into a plurality of representative digital output signals, comprising the steps of:

receiving a first portion of a plurality of input digital signal bits and in accordance therewith generating one or more intermediate digital signals with one or more corresponding digital pulse densities which correspond to a digital count of said first portion of said plurality of input digital signal bits;

receiving a second portion of said plurality of input digital signal bits and in accordance therewith generating a plurality of digital control signal sets; and receiving said one or more intermediate digital signals and a corresponding one of said plurality of digital control signal sets and in accordance therewith generating a corresponding one of a plurality of digital output signals, wherein each one of said plurality of digital control signal sets determines whether said one or more intermediate digital signals or an individual signal of said each one of said plurality of digital control signal sets is provided as said corresponding one of said plurality of digital output signals;

wherein said step of receiving a second portion of said plurality of input digital signal bits and in accordance therewith generating a plurality of digital control signal sets comprises receiving M more significant bits of an N-bit input digital signal, and said step of receiving a first portion of a plurality of input digital signal bits and in accordance therewith generating one or more intermediate digital signals with one or more corresponding digital pulse densities which correspond to a digital count of said first portion of said plurality of input digital signal bits comprises receiving N-M less significant bits of said N-bit input digital signal and in accordance therewith generating said one or more intermediate digital signals with said one or more corresponding digital pulse densities, wherein each one of said one or more corresponding digital pulse densities corresponds to an integer count R where $0 \leq R \leq 2^{(N-M)}-1$.

22. A method of converting a plurality of input digital signal bits into a plurality of representative digital output signals, comprising the steps of:

receiving a first portion of a plurality of input digital signal bits and in accordance therewith generating one or more intermediate digital signals with one or more corresponding digital pulse densities which correspond to a digital count of said first portion of said plurality of input digital signal bits;

receiving a second portion of said plurality of input digital signal bits and in accordance therewith generating a plurality of digital control signal sets; and receiving said one or more intermediate digital signals and a corresponding one of said plurality of digital control signal sets and in accordance therewith generating a corresponding one of a plurality of digital output signals, wherein each one of said plurality of digital control signal sets determines whether said one or more intermediate digital signals or an individual signal of said each one of said plurality of digital control signal sets is provided as said corresponding one of said plurality of digital output signals;

wherein said step of receiving a second portion of said plurality of input digital signal bits and in accordance therewith generating a plurality of digital control signal sets comprises receiving M more significant bits of an N-bit input digital signal, and generating I digital control signal sets as said plurality of digital control signal sets, wherein I=integer digital count of said M-bit signal+1. $1 \leq I \leq 2^M$ and each one of said plurality of digital control signal sets includes a first digital control signal $A_J$ and a second digital control signal $B_J$, such that, for $I=1, 2, 3, \ldots, 2^M$, $J=1, 2, 3, \ldots, 2^M$ and $I \neq J$, $A_J=1$ (logic 1), $A_J=0$ (logic 0) for $J>I$, $A_J=X$ ("don't care") for $J<I$, $B_J=1$ (logic 1) for $J<I$, and $B_J=0$ (logic 0) for $J>I$.

23. A method of converting a plurality of input digital signal bits into a plurality of representative digital output signals, comprising the steps of:

receiving a first portion of a plurality of input digital signal bits and in accordance therewith generating one or more intermediate digital signals with one or more corresponding digital pulse densities which correspond to a digital count of said first portion of said plurality of input digital signal bits;

receiving a second portion of said plurality of input digital signal bits and in accordance therewith generating a plurality of digital control signal sets;

receiving said one or more intermediate digital signals and a corresponding one of said plurality of digital control signal sets and in accordance therewith generating a corresponding one of a plurality of digital output signals, wherein each one of said plurality of digital control signal sets determines whether said one or more intermediate digital signals or an individual signal of said each one of said plurality of digital control signal sets is provided as said corresponding one of said plurality of digital output signals; and converting said plurality of digital output signals to a plurality of analog output signals, wherein said plurality of analog output signals represents a digital count of said plurality of input digital signal bits; wherein said step of receiving a second portion of said plurality of input digital signal bits and in accordance therewith generating a plurality of digital control signal sets comprises receiving M more significant bits of an N-bit input digital signal, said step of receiving a first portion of a plurality of input digital signal bits and in accordance therewith generating one or more intermediate digital signals with one or more corresponding digital pulse densities which correspond to a digital count of said first portion of said plurality of input digital signal bits comprises receiving N-M less significant bits of said N-bit input digital signal and in accordance therewith generating said one or more intermediate digital signals with said one or more corresponding digital pulse densities, and said step of converting said plurality of digital output signals to a plurality of analog output signals comprises converting each one of said plurality of digital output signals to an analog output signal having a value which corresponds to an integer count R where $0 \leq R \leq 2^{(N-M)}-1$.

* * * * *

UNITED STATES PATENT AND TRADEMARK OFFICE
CERTIFICATE OF CORRECTION

PATENT NO.: 5,784,019
DATED: July 21, 1998
INVENTOR(S): Hee Wong et al.

It is certified that an error appears in the above-identified patent and that said Letters Patent is hereby corrected as shown below:

In Col. 6, line 51, delete "$0 \leq R \leq 2^{(NM)}-1$" and replace with --$0 \leq R \leq 2^{(N-M)}-1$--.

Signed and Sealed this

Twenty-second Day of September, 1998

Attest:

BRUCE LEHMAN

Attesting Officer

Commissioner of Patents and Trademarks